(12) United States Patent
Clemen, Jr. et al.

(10) Patent No.: US 10,790,078 B2
(45) Date of Patent: Sep. 29, 2020

(54) APPARATUS AND METHOD FOR MAGNETIC FIELD COMPRESSION

(71) Applicant: THE BOEING COMPANY, Chicago, IL (US)

(72) Inventors: Mark Joseph Clemen, Jr., Port Orchard, WA (US); John R. Hull, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 358 days.

(21) Appl. No.: 15/784,831

(22) Filed: Oct. 16, 2017

(65) Prior Publication Data

US 2019/0115131 A1 Apr. 18, 2019

(51) Int. Cl.
*H01F 6/06* (2006.01)
*H01F 41/04* (2006.01)
*G01R 33/381* (2006.01)
*H01F 6/04* (2006.01)
*G01R 33/3815* (2006.01)

(52) U.S. Cl.
CPC .......... *H01F 6/06* (2013.01); *G01R 33/381* (2013.01); *H01F 41/048* (2013.01); *G01R 33/3815* (2013.01); *H01F 6/04* (2013.01)

(58) Field of Classification Search
CPC . H01F 6/06; H01F 41/048; H01F 6/04; G01R 33/381; G01R 33/3815
See application file for complete search history.

(56) References Cited

U.S. PATENT DOCUMENTS

| | | | |
|---|---|---|---|
| 3,801,942 A * | 4/1974 | Elsel | H01F 6/06 335/216 |
| 4,217,171 A | 8/1980 | Schaffer | |
| 4,277,768 A | 7/1981 | Burgeson et al. | |
| 4,305,784 A | 12/1981 | Ohkawa | |
| 4,920,095 A | 4/1990 | Ishigaki et al. | |
| 5,010,555 A | 4/1991 | Madey et al. | |
| 5,011,820 A | 4/1991 | Ehrhart et al. | |
| 5,675,304 A | 10/1997 | Georgiyevskiy | |
| 6,222,434 B1 | 4/2001 | Nick | |
| 6,445,130 B1 | 9/2002 | Leupold | |
| 7,889,042 B2 * | 2/2011 | Meinke | H01F 5/00 336/170 |

(Continued)

OTHER PUBLICATIONS

WIKIPEDIA; "Free-electron laser," downloaded from <https://en.wikipedia.org/wiki/Free-electron_laser> on Oct. 13, 2017, 8 Pages.

(Continued)

*Primary Examiner* — Mohamad A Musleh
(74) *Attorney, Agent, or Firm* — Sage Patent Group

(57) ABSTRACT

An apparatus for magnetic field compression includes a plurality of tubes of different dimensions. Each smaller tube extends within a larger tube and each tube includes an electrically conductive material for generating a magnetic field in response to electric current flowing in the conductive material. A longitudinal slot is formed in each tube. The longitudinal slot in each tube is aligned to form an aperture in which the magnetic field is compressed or has a highest magnetic flux in the aperture in response to the electric current flowing in the conductive material of each tube.

20 Claims, 9 Drawing Sheets

(56) References Cited

U.S. PATENT DOCUMENTS

| | | | |
|---|---|---|---|
| 2003/0184427 A1* | 10/2003 | Gavrilin | H01F 7/20 336/200 |
| 2009/0278647 A1 | 11/2009 | Buswell | |
| 2016/0049229 A1 | 2/2016 | Bromberg et al. | |
| 2019/0115713 A1 | 4/2019 | Clemen, Jr. et al. | |

OTHER PUBLICATIONS

Motz, H.; "Applications of the Radiation from Fast Electron Beams," Journal of Applied Physics, 1951, pp. 527-535, vol. 22.

\* cited by examiner

APPARATUS AND METHOD FOR MAGNETIC FIELD COMPRESSION

CROSS REFERENCE TO RELATED APPLICATION

This application is related to U.S. application Ser. No. 15/785,022, entitled "Apparatus and Method for Generating a High Power Energy Beam Based Laser," which is assigned to the same assignee as the present application, filed on the same date as the present application, which has issued as U.S. Pat. No. 10,680,400 on Jun. 9, 2020, and is incorporated herein by reference.

This application is related to U.S. application Ser. No. 15/785,155, entitled "Apparatus and Method for Magnetic Field Compression Using a Toroid Coil Structure," which is assigned to the same assignee as the present application, filed on the same date as the present application, which has issued as U.S. Pat. No. 10,726,986 on Jul. 28, 2020, and is incorporated herein by reference.

FIELD

The present disclosure relates to devices and methods for generating magnetic fields and more particularly to an apparatus and method for magnetic field compression.

BACKGROUND

Permanent magnetics generate a maximum magnetic field strength or maximum magnetic flux of about one (1) Tesla (T). Magnetic materials that may be used to enhance magnetic field strength or magnetic flux saturate at about 1 T. Substantially higher magnetic field strengths of about 10 T or higher may be achieved in small limited volumes but generally require large coils wound with wire or tape of a superconducting material. Accordingly, there is a need for an apparatus and method for generating large-scale or high strength magnetic fields for certain applications, such as for example, controlling high-energy electron or ion beams or similar radiation beams.

SUMMARY

In accordance with an embodiment, an apparatus for magnetic field compression includes a plurality of tubes of different dimensions. Each smaller tube extends within a larger tube and each tube includes an electrically conductive material for generating a magnetic field in response to electric current flowing in the conductive material. A longitudinal slot is formed in each tube. The longitudinal slot in each tube is aligned to form an aperture in which the magnetic field is compressed or has a highest magnetic flux in the aperture in response to the electric current flowing in the conductive material of each tube.

In accordance with another embodiment, an apparatus for magnetic field compression includes a plurality of cylindrical tubes of different diameters. Each smaller cylindrical tube extending within a larger cylindrical tube and each cylindrical tube includes an electrically conductive material for generating a magnetic field in response to electric current flowing in the conductive material. A longitudinal slot is formed in each cylindrical tube. The longitudinal slot in each cylindrical tube is aligned to form an aperture in which the magnetic field is compressed or has a highest magnetic flux in the aperture in response to the electric current flowing in the conductive material of each tube.

In accordance with a further embodiment, a method for magnetic field compression includes providing a plurality of tubes of different dimensions and extending each smaller tube within a larger tube. Each tube includes an electrically conductive material for generating a magnetic field in response to electric current flowing in the conductive material. The method additionally includes forming a longitudinal slot in each tube and forming an aperture by aligning the longitudinal slot in each tube. The magnetic field is compressed or has a highest magnetic flux in the aperture in response to the electric current flowing in the conductive material of each tube.

In accordance with another embodiment or any of the previous embodiments, each of the plurality of tubes includes a substrate that has an inner surface and an outer surface. An inside layer of electrically conductive material or semiconductor material is disposed on the inner surface of each substrate of those tubes that enclose another tube of the plurality of tubes. An outside layer of electrically conductive material or semiconductor material is disposed on the outer surface of each substrate of those tubes that are enclosed by another tube of the plurality of tubes.

In accordance with another embodiment or any of the previous embodiments, the substrate includes one of an electrical insulator material, an electrical semiconductor material or an electrical conductive material.

In accordance with another embodiment or any of the previous embodiments, the substrate includes a material selected from a group consisting of magnesium oxide on metal, aluminum oxide on metal, yttrium oxide on metal, glass, sapphire covered tempered glass, carbon fiber composite, aluminate on metal, or aluminate on carbon fiber composite.

In accordance with another embodiment or any of the previous embodiments, the inside layer and the outside layer of electrically conductive material or semiconductor material comprise a superconducting material.

In accordance with another embodiment or any of the previous embodiments, the superconducting material includes a superconducting crystalline material grown on the surfaces of the substrate. The substrate includes a suitable material for growing the superconducting crystalline material.

In accordance with another embodiment or any of the previous embodiments, the inside layer and the outside layer of electrically conductive material or semiconductor material includes a superconducting metal alloy that is plated on the substrate, plasma sprayed on the substrate, or thermal-sprayed on the substrate. The substrate includes a suitable mechanical frame for the superconducting metal alloy.

In accordance with another embodiment or any of the previous embodiments, the substrate includes one of steel, a nickel alloy and carbon fiber composite.

In accordance with another embodiment or any of the previous embodiments, the apparatus further includes an electric current supply electrically connected to each inside layer of electrically conductive material and each outside layer of electrically conductive material for generating an electric current flow in each layer of electrically conductive material and a compressed magnetic field in the aperture.

In accordance with another embodiment or any of the previous embodiments, each electric current supply comprises an adjustable electric current supply configured for adjusting a balance of currents among the plurality of tubes and modifying the magnetic field across the aperture.

In accordance with another embodiment or any of the previous embodiments, wherein the tubes are substantially cylindrically-shaped.

In accordance with another embodiment or any of the previous embodiments, wherein the tubes are non-cylindrically-shaped.

In accordance with another embodiment or any of the previous embodiments, the apparatus further includes a device for circulating a coolant between the tubes.

In accordance with another embodiment or any of the previous embodiments, wherein the aperture includes a predetermined size for inserting an object within the aperture.

In accordance with another embodiment or any of the previous embodiments, wherein the aperture is configured to control an electron beam based laser.

In accordance with an embodiment and any of the previous embodiments, wherein the tubes are nonconcentric.

In accordance with another embodiment or any of the previous embodiments, wherein the plurality of tubes define a first plurality of nonconcentric tubes and the aperture defines a first aperture in which a first magnetic field is compressed in response to a first electric current flowing in the first plurality of nonconcentric tubes. The apparatus further includes a second plurality of nonconcentric tubes of different dimensions. Each smaller tube extending within a larger tube and each tube includes an electrically conductive material for generating a second magnetic field in response to electric current flowing in the electrically conductive material. A longitudinal slot is formed in each tube of the second plurality of nonconcentric tubes. The longitudinal slot in each tube is aligned to form a second aperture in which the second magnetic field is compressed in the second aperture in response to the electric current flowing in the conductive material of each tube. The second aperture is aligned with the first aperture to form an enlarged cavity in which the first magnetic field and the second magnetic field are both compressed or have a highest magnetic flux in response to the electric current flowing in the conductive material of each tube.

The features, functions, and advantages that have been discussed can be achieved independently in various embodiments or may be combined in yet other embodiments further details of which can be seen with reference to the following description and drawings.

DETAILED DESCRIPTION

Figure 1A:
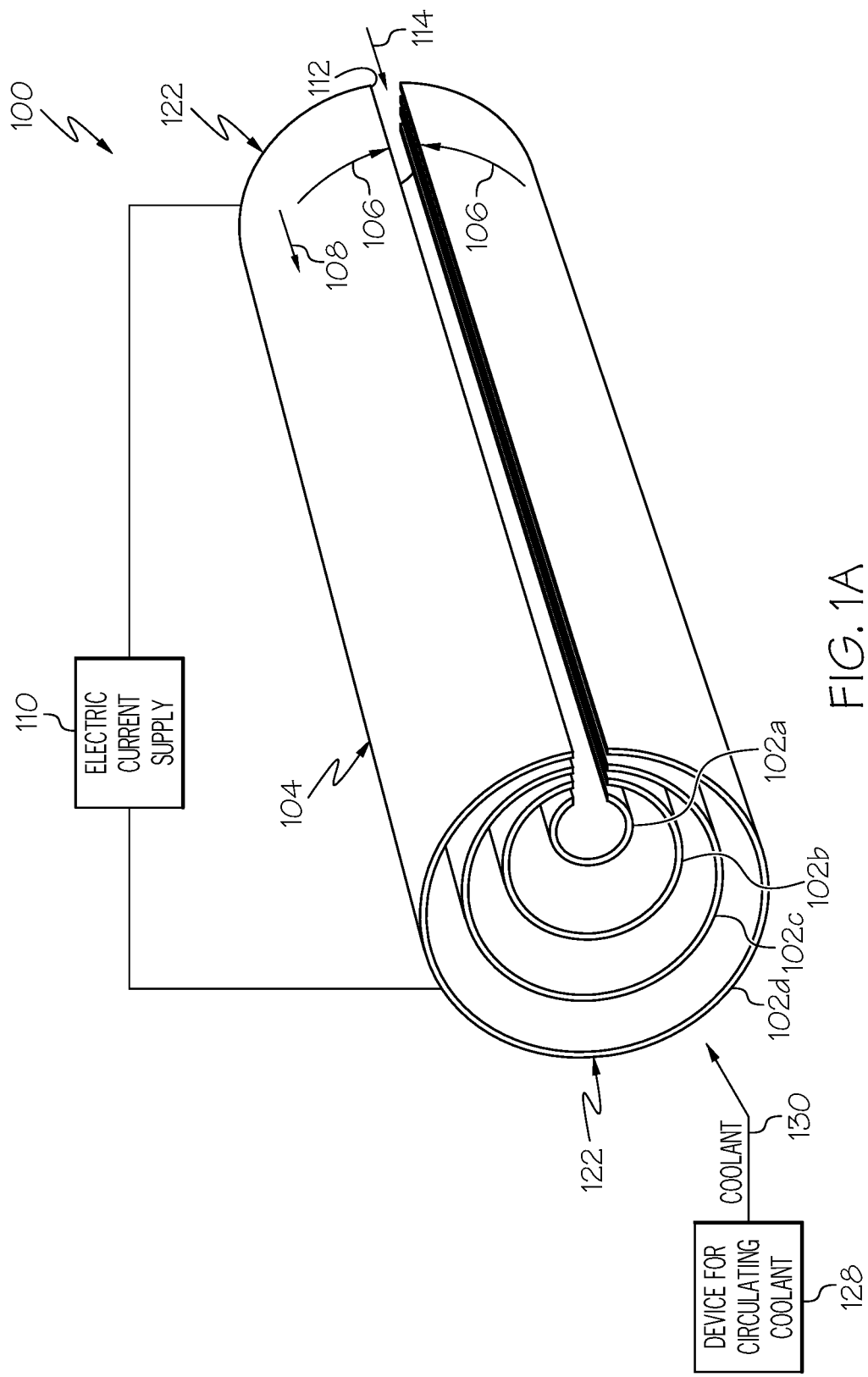
FIG. 1A is a perspective view of an example of an apparatus for magnetic field compression in accordance with an embodiment of the present disclosure.

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

Figure 1B:
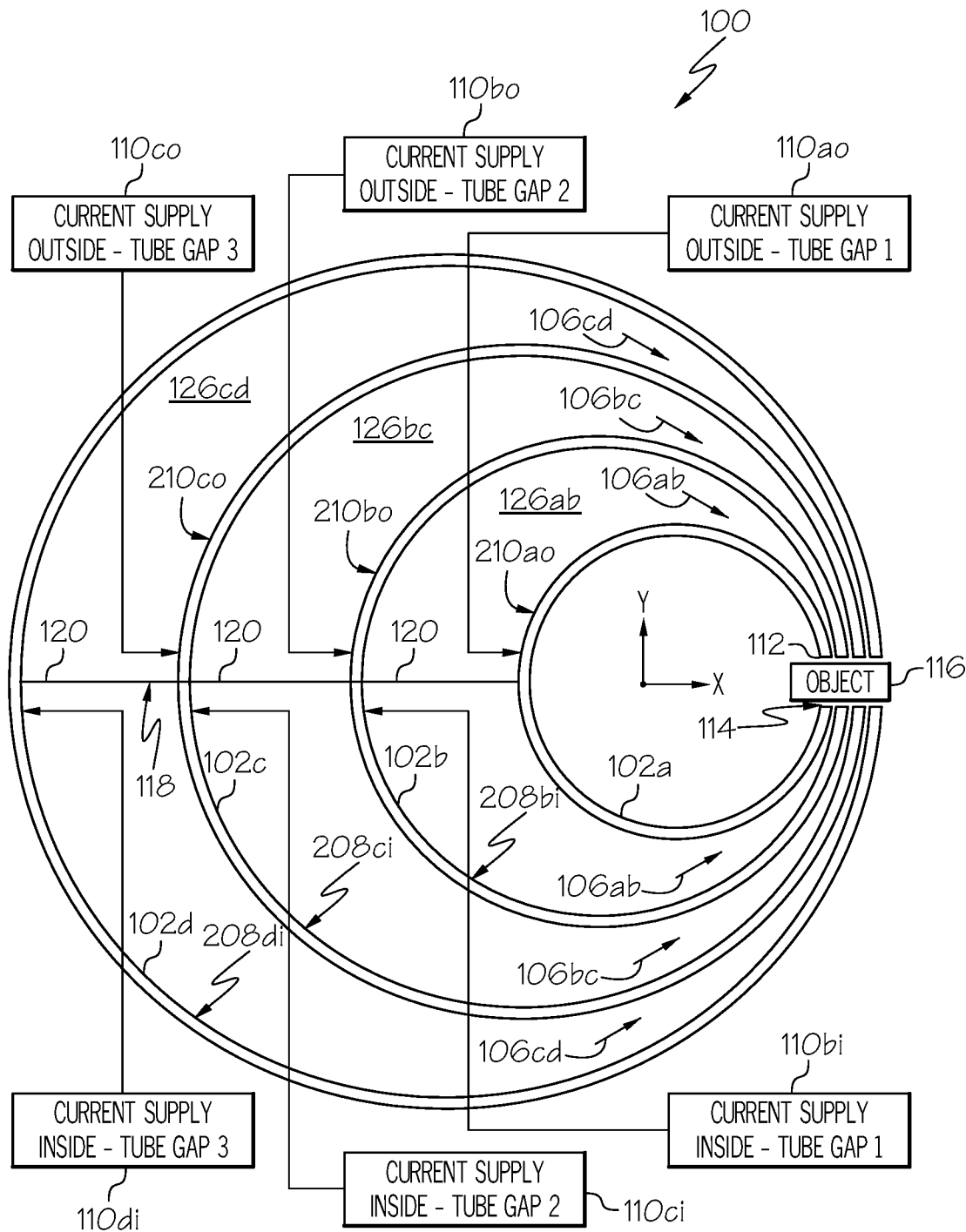
FIG. 1B is an end view of the exemplary apparatus for magnetic field compression in FIG. 1A.

Referring to FIGS. 1A and 1B, FIG. 1A is a perspective view of an example of an apparatus 100 for magnetic field compression in accordance with an embodiment of the present disclosure. FIG. 1B is an end view of the exemplary apparatus 100 for magnetic field compression in FIG. 1A. The apparatus 100 includes a plurality of tubes 102a-102d of different dimensions or diameters. In the exemplary embodiment shown in FIGS. 1A and 1B, the tubes 102a-102d are nonconcentric and are cylindrically shaped and each tube 102a-102d includes a different diameter. In other embodiments, the tubes 102a-102d are non-cylindrically shaped. For example, each tube 102a-102d is substantially rectangular shaped similar to that illustrated in the exemplary embodiment illustrated in FIG. 3. Other embodiments include tubes 102a-102d having other types of non-cylindrical shapes depending upon the design of the apparatus 100 or particular application or use of the apparatus 100. In accordance with other embodiments, the apparatus 100 includes two tubes 102a and 102b or any number of tubes 102a-102n depending upon the design and application of the apparatus. The dimension or diameter of the tubes 102a-102d is also based on the design and application of the apparatus. In accordance with the embodiment illustrated in FIGS. 1A and 1B, the tubes 102a-102d are nonconcentric in that a center or longitudinal axis of each tube 102a-102d is offset or spaced a predetermined distance from a center or longitudinal axis of a subsequent or adjacent outer tube. In other embodiments, the tubes are concentric or have some other configuration.

Each smaller tube 102 is disposed within a larger tube 102 of the plurality of tubes 102a-102d and extend within the larger tube 102 and parallel with the larger tube 102. Each tube 102a-102d includes an electrically conductive material 104 or semiconductor material for generating a magnetic field, illustrated by arrows 106, in response to electric current 108 flowing in the conductive material 104. As described in more detail with reference to FIGS. 1B and 2, the conductive material 104 is on an outer surface of some tubes 102a-102d, an inner surface of some tubes 102a-102d, or on both an outer surface and inner surface depending upon whether the tube is enclosed by another larger tube or the tube encloses another smaller tube and a magnetic field is to be generated in a gap between adjacent tubes 102a-102d by current flowing in opposite directions in the conductive material 104 in the adjacent tubes 102a-102d. Generally, the conductive material 104 is placed on the facing or opposing surfaces of adjacent tubes 102a-102d to generate a magnetic field 106 in the gap between the adjacent tubes 102a-102d in response to electric current 108 flowing in opposite directions in the conductive material 104 of the adjacent tubes 102a-102d. Examples of the electrically conductive material 104 will be described in more detail with reference to FIG. 2. In accordance with an embodiment, an electric current supply 110 is electrically connected across the electrically conductive material 104 of each tube 102a-102d to cause electric current 108 to flow in the electrically conductive material 104 of the tubes 102a-102d. The electric current supply or supplies 110 are configured to supply one of continuous electric currents, alternating electric currents or pulsed electric currents.

A longitudinal slot 112 is formed in each tube 102a-102d. The longitudinal slot 112 in each tube 102a-102d is aligned to form an aperture 114 in which the magnetic field 106 is compressed or has a highest magnetic field strength or highest magnetic flux in the aperture 114 in response to the electric current 108 flowing in the conductive material 104 of each tube 102a-102d. In accordance with an embodiment, the tubes 102a-102d and the aperture 114 are a predetermined size to insert an object 116 (FIG. 1B) within the aperture 114. In one example, the apparatus 100 is part of a magnetic resonance image machine (not shown) for performing magnetic resonance imaging of the object 116. The apparatus 100 is applicable to non-destructive evaluation and imaging techniques, such as magnetic resonance imaging for medical purposes or other imaging applications. In another example described in U.S. application Ser. No. 15/785,022, entitled "Apparatus and Method for Generating a High Power Energy Beam Based Laser," the object 116 is an electron beam, ion beam or the like that is controlled by the apparatus 100. Accordingly, the aperture 114 is configured to control an electron beam, electron beam based laser, ion beam or the like. The apparatus 100 is applicable for any purpose where magnetic field compression or a high magnetic field strength or high magnetic flux up to about 10 T or higher in the aperture 114 is desired.

As best shown in FIG. 1B, the tubes 102a-102d are held in position relative to one another by a suitable support structure 118. For example, the support structure 118 includes one or more support members 120 extending between adjacent tubes 102a-102d. In accordance with an embodiment, the support members 120 are positioned at opposite ends 122 of the tubes 102a-102a and/or at intermediate locations within the tubes 102a-102d. The support members 120 are made from a material and are attached to the tubes 102a-102d by a suitable fastening arrangement that substantially minimizes or prevents any interference with the electric current flow 108 or magnetic field 106 or fields generated in the apparatus 100.

Figure 2:
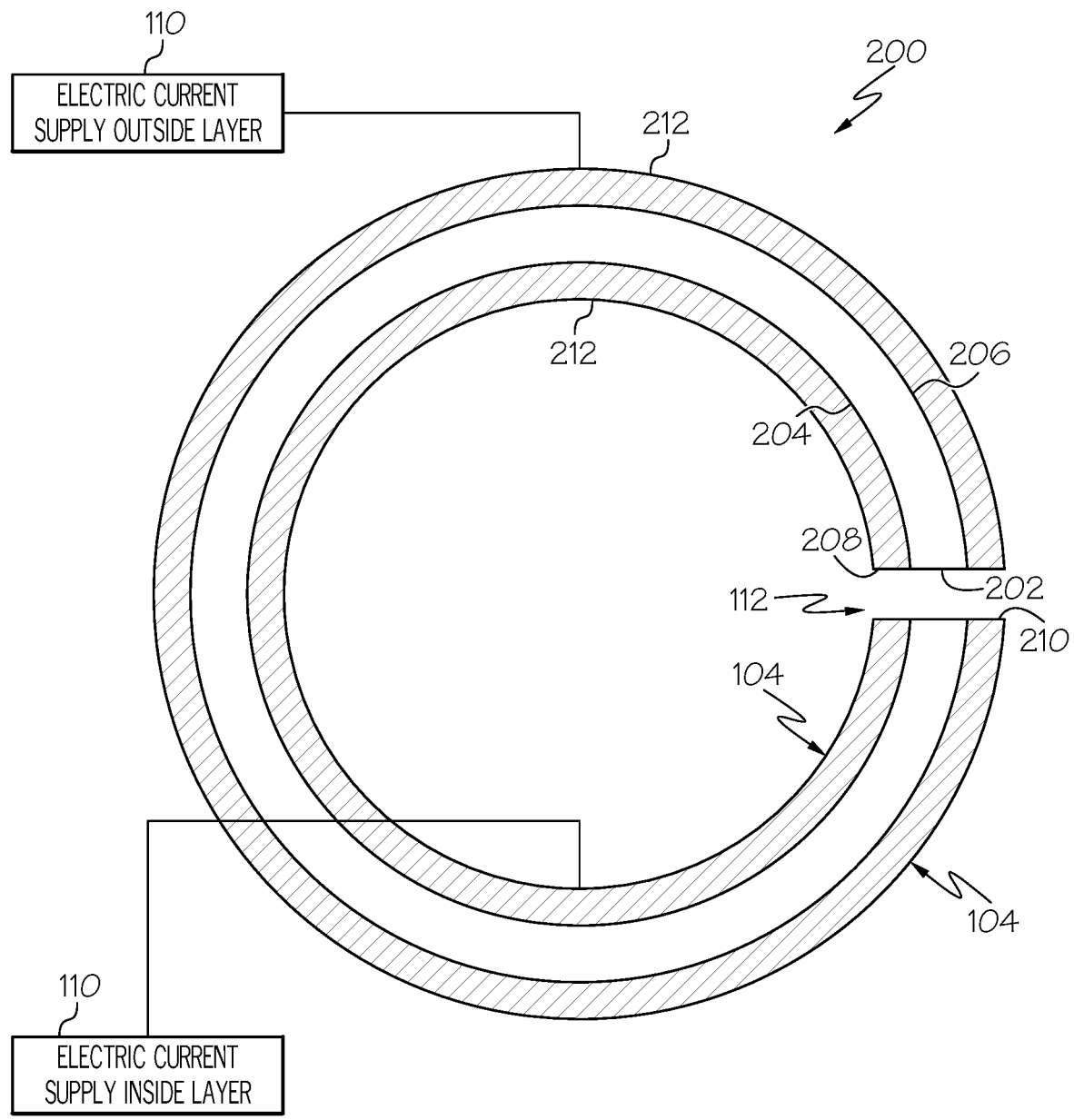
FIG. 2 is a detailed cross-sectional view of an example of a substantially cylindrically shaped tube for an apparatus for magnetic field compression in accordance with an embodiment of the present disclosure.

Referring also to FIG. 2, FIG. 2 is a detailed cross-sectional view of an example of a substantially cylindrically shaped tube 200 for an apparatus for magnetic field compression in accordance with an embodiment of the present disclosure. In accordance with an example, the substantially cylindrically shaped tube 200 is used for the tubes 102a-102d of the exemplary apparatus 100 in FIGS. 1A and 1B. The tube 200 or tubes 102a-102d are substantially cylindrically shaped in that the tubes may not be exactly cylindrically shaped and as described herein include a longitudinal slot 112 formed in each tube 200, 102a-102d. In accordance with an embodiment, each of the plurality of tubes 102a-102b include a substrate 202. The substrate 202 includes an inner surface 204 and an outer surface 206. An inside layer 208 of electrically conductive material 104 or semiconductor material is disposed on the inner surface 204 of at least each substrate 202 of those tubes 102 that enclose another tube 102 of the plurality of tubes 102a-102d. An outside layer 210 of electrically conductive material 104 or semiconductor material is disposed on the outer surface 206 of each substrate 202 of at least those tubes 102 that are enclosed by another tube 102 of the plurality of tubes 102a-102d.

Also referring back to FIG. 1B, an inner most tube 102a includes an outer layer 210ao of electrically conductive material 104. An electric current supply 110ao is electrically connected to the outer layer 210ao of electrically conductive material 104 for generating current flow in the outer layer 210ao of electrically conductive material 104. A second inner most tube 102b includes an inside layer 208bi of electrically conductive material 104. An electric current supply 110bi is electrically connected to the inside layer 208bi of electrically conductive material 104 for generating current flow in the inside layer 208bi of electrically conductive material 104. The electric current supply 110ao and 110bi are configured to cause current to flow in opposite directions in outside layer 210ao and inside layer 208bi to generate a magnetic field 106ab in a gap 126ab between the tubes 102a and 102b that is compressed into the aperture 114 to a very high strength or high magnetic flux. In accordance with some embodiments, the magnetic field 106ab is compressed to a very high strength or high magnetic flux density of up to about 10 T or higher by the opposite layers 208 and 210 of electrically conductive material 104 being superconductive material as described in more detail herein.

Similarly, the second inner most tube 102b includes an outside layer 210bo of electrically conductive material 104 and a third tube 102c includes an inside layer 208ci of electrically conductive material 104. An electric current supply 110bo is electrically connected across the outside layer 210bo of the second inner most tube 102b and another electric current supply 110ci is electrically connected across the inside layer 208ci of the third tube 102c. Similar to that previously described, the current supplies 110bo and 110ci are configured to cause current to flow in opposite directions in the outside layer 210bo of tube 102b and opposing or facing inside layer 208ci of third tube 102c to generate a second magnetic field 106bc in a gap 126bc between second tube 102b and third tube 102c.

The third tube 102c also includes an outside layer 210co of electrically conductive material 104 and a fourth tube 102d includes an inside layer 208di of electrically conductive material 104. An electric current supply 110co is electrically connected across the outside layer 210co of the third tube 102c and another electric current supply 110di is electrically connected across the inside layer 208di of the fourth tube 102d. Similar to that previously described, the current supplies 110co and 110di are configured to cause current to flow in one direction in the outside layer 210co of tube 102c and in an opposite direction in the facing inside layer 208di of fourth tube 102d to generate a third magnetic field 106cd in a gap 126cd between third tube 102c and fourth tube 102d. The magnetic fields 106 generated in the gaps 126 are compressed into the aperture 114 to a very high strength or high magnetic flux. In accordance with some embodiments, the magnetic fields 106 are compressed to a very high strength or high magnetic flux density of up to about 10 T or higher by the adjacent inner layers 208 and outer layers 210 of electrically conductive material 104 being superconducting material as described in more detail herein. In accordance with another embodiment, the electric current supplies 110 are replaced by a single current supply and the electric current is distributed to the layers 208 and 210 of conductive material 104 by dividing the current from the single current supply.

Figure 5A:
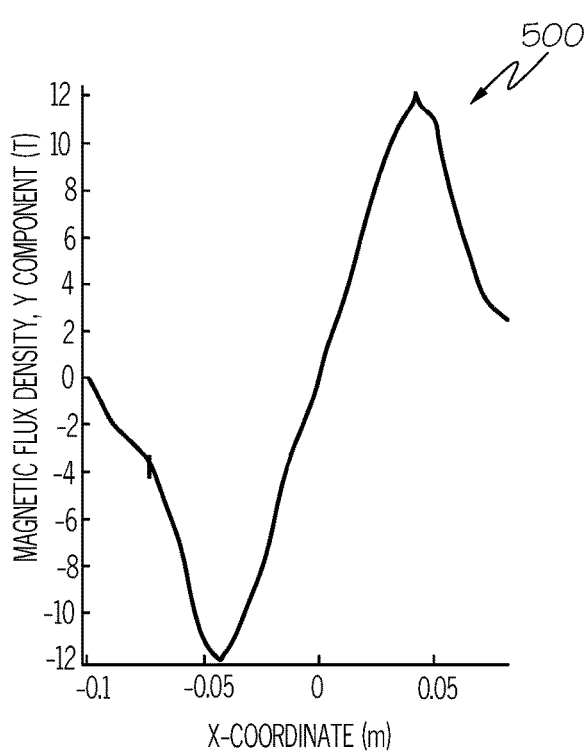
FIGS. 5A-5C are graphs illustrating modification of the magnetic field across the aperture by adjusting the currents in the tubes of the apparatus for magnetic field compression in accordance with an embodiment of the present disclosure.
Figure 5B:
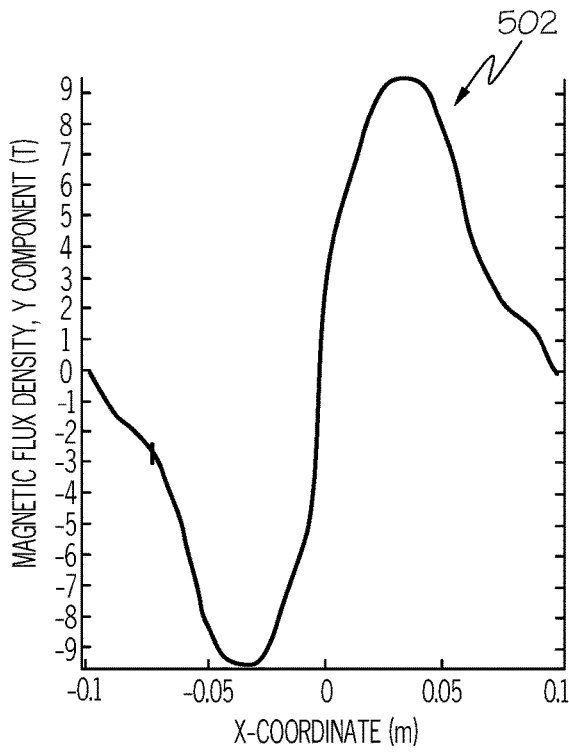
Figure 5C:
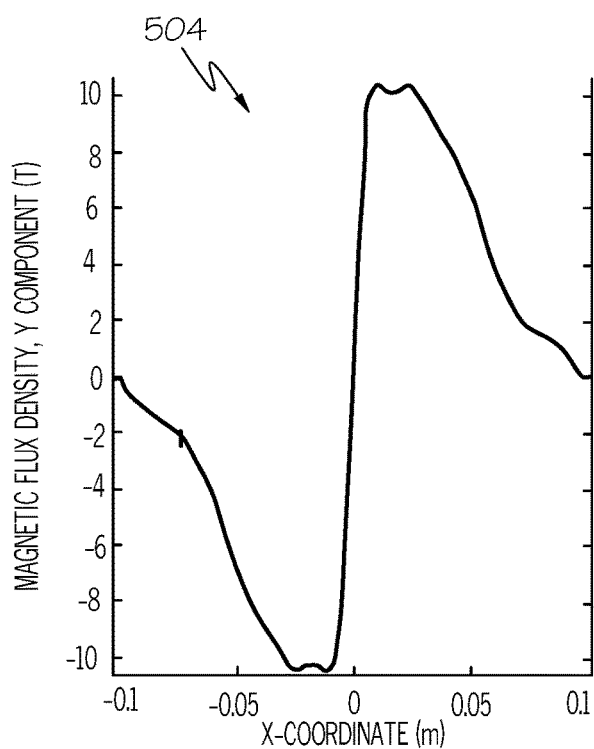

In other embodiments, the single current supply includes an adjustable current supply or the plurality of current supplies 110 each include an adjustable supply configured for adjusting a balance of currents among the plurality of tubes 102a-102d and modifying the magnetic fields 106 across the aperture 114. FIGS. 5A-5C are graphs 500, 502 and 504 illustrating modification of the magnetic field 106 across the aperture 114 by adjusting the electric currents 108 in the tubes 102a-102d of the apparatus 100 for magnetic field compression in the aperture 114 in accordance with an embodiment of the present disclosure. The horizontal or x-coordinate axis in FIGS. 5A-5C is distance across the aperture 114 in meters. The vertical or y-coordinate axis in FIGS. 5A-5C is magnetic flux density in Tesla (T). The zero (0) x-coordinate corresponds to the center of the aperture 114.

Referring again to FIG. 2, in accordance with an embodiment, the substrate 202 of the exemplary tube 200 useable for the tubes 102a-102d includes one of an electrical insulator material, a semiconductor material, or an electrical conductive material. Examples of the substrate material include but are not necessarily limited to magnesium oxide on metal, aluminum oxide on metal, yttrium oxide on metal, glass, sapphire covered tempered glass, carbon fiber composite, aluminate on metal, or aluminate on carbon fiber composite.

In accordance with an embodiment, the inside layer 208, if present in a particular tube 102a-102d, and the outside layer 210, if present in a particular tube 102a-102d, includes a superconducting material 212. Examples of the superconducting material 212 include but are not necessarily limited to a superconducting crystalline material grown on the surfaces 204 and 206 of the substrate 202. The substrate 202 includes any suitable material for growing the superconducting crystalline material. Examples of forming the inside layer 208 and the outside layer 210 of superconducting material 212 include a superconducting metal alloy that is plated on the substrate 202, plasma sprayed on the substrate 202, or thermal-sprayed on the substrate 202. The substrate 202 includes any suitable mechanical frame for the superconducting metal alloy. For example, the substrate 202 includes one of steel, a nickel alloy, carbon fiber composite or other suitable frame material for the superconducting material 212. In accordance with other examples, the superconductors are formed by metalorganic chemical vapor deposition (MOCVD), ion beam assisted deposition (IBAD) or similar superconductor fabrication techniques.

In accordance with an embodiment, the apparatus 100 includes a device 128 (FIG. 1A) for circulating a coolant 130 between the tubes 102a-102d. Examples of the coolant 130 include liquid nitrogen or other coolant for use in cooling superconducting material.

Figure 3:
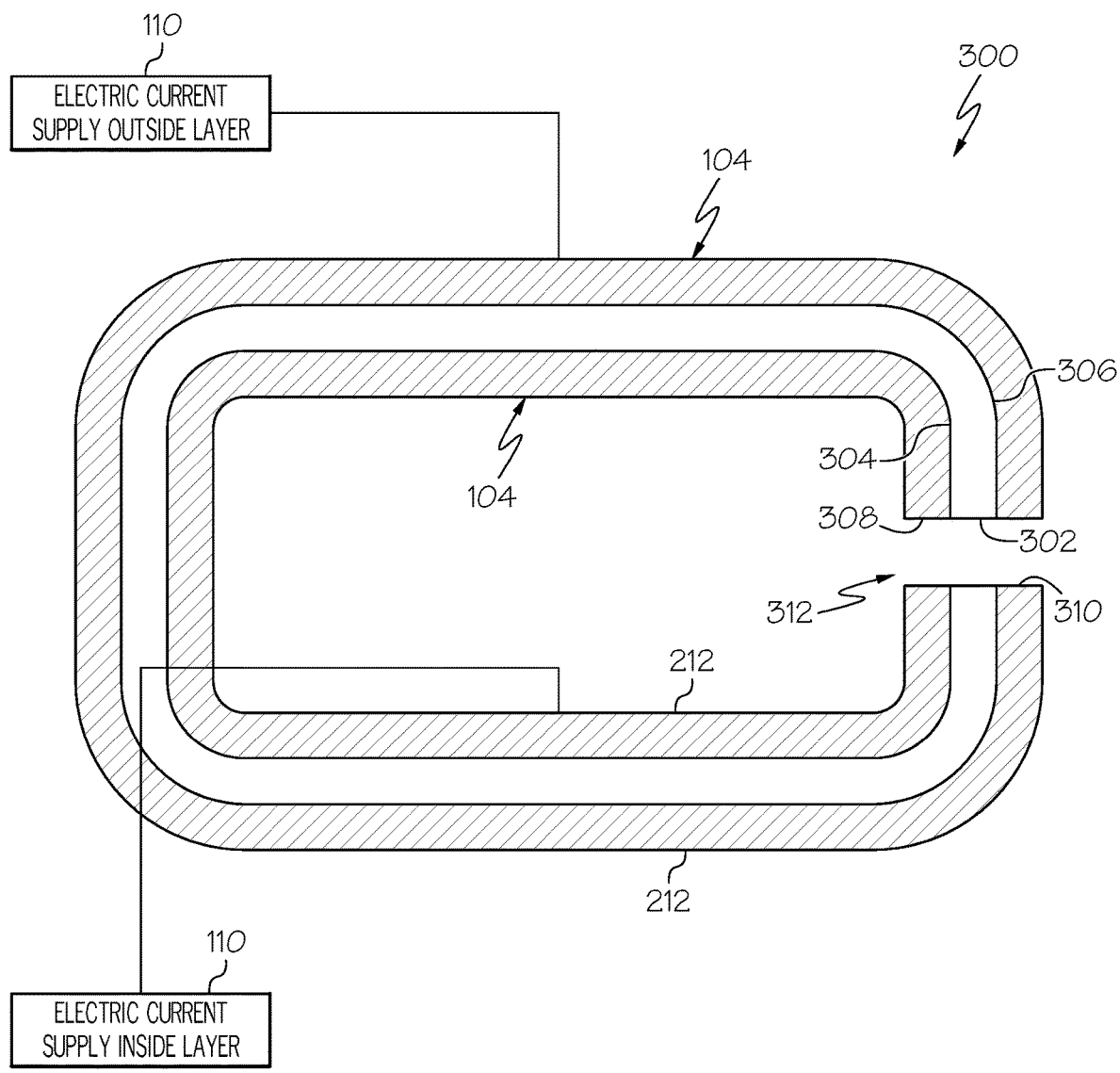
FIG. 3 is a cross-sectional view of an example of a tube for an apparatus for magnetic field compression in accordance with another embodiment of the present disclosure.

Referring to FIG. 3, FIG. 3 is a cross-sectional view of an example of a tube 300 for an apparatus for magnetic field compression in accordance with another embodiment of the present disclosure. The exemplary tube 300 is similar to the tube 200 in FIG. 2 except the tube 300 includes a non-cylindrical shape. The exemplary tube 300 illustrated in FIG. 3 is substantially rectangular shaped with rounded corners and a longitudinal slot 312. The exemplary tube 300 could also have square corners and could be square shaped in other examples. In accordance with other embodiments, the tube 300 is used for the tubes 102a-102d in FIGS. 1A and 1B. The tube 300 includes a substrate 302 with an inner surface 304 and an outer surface 306. An inside layer 308 of electrically conductive material 104 or semiconductor material is disposed on the inner surface 304 of each substrate 302 of at least those tubes 300 or 102a-102d that enclose another smaller tube of the plurality of tubes 102a-102d. An outside layer 310 of electrically conductive material 104 or semiconductor material is disposed on the outer surface 306 of each substrate 302 of at least those tubes 300 or 102a-102d that are enclosed by another larger tube of the plurality of tubes 102a-102d.

Figure 4A:
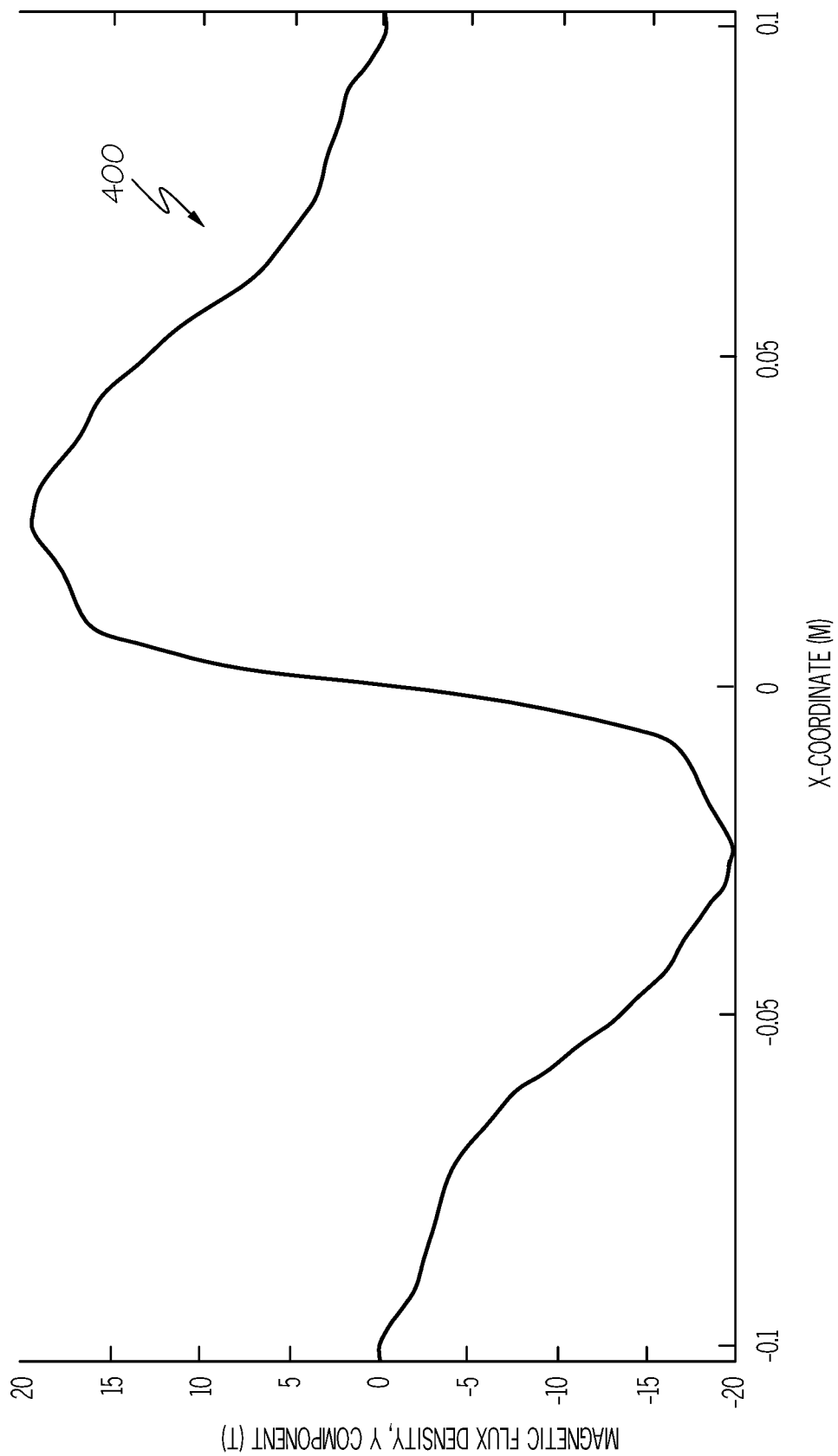
FIG. 4A is graph illustrating compression of the magnetic field measured across an aperture of the apparatus for magnetic field compression in a horizontal or x-coordinate direction across the aperture in accordance with an embodiment of the present disclosure.
Figure 4B:
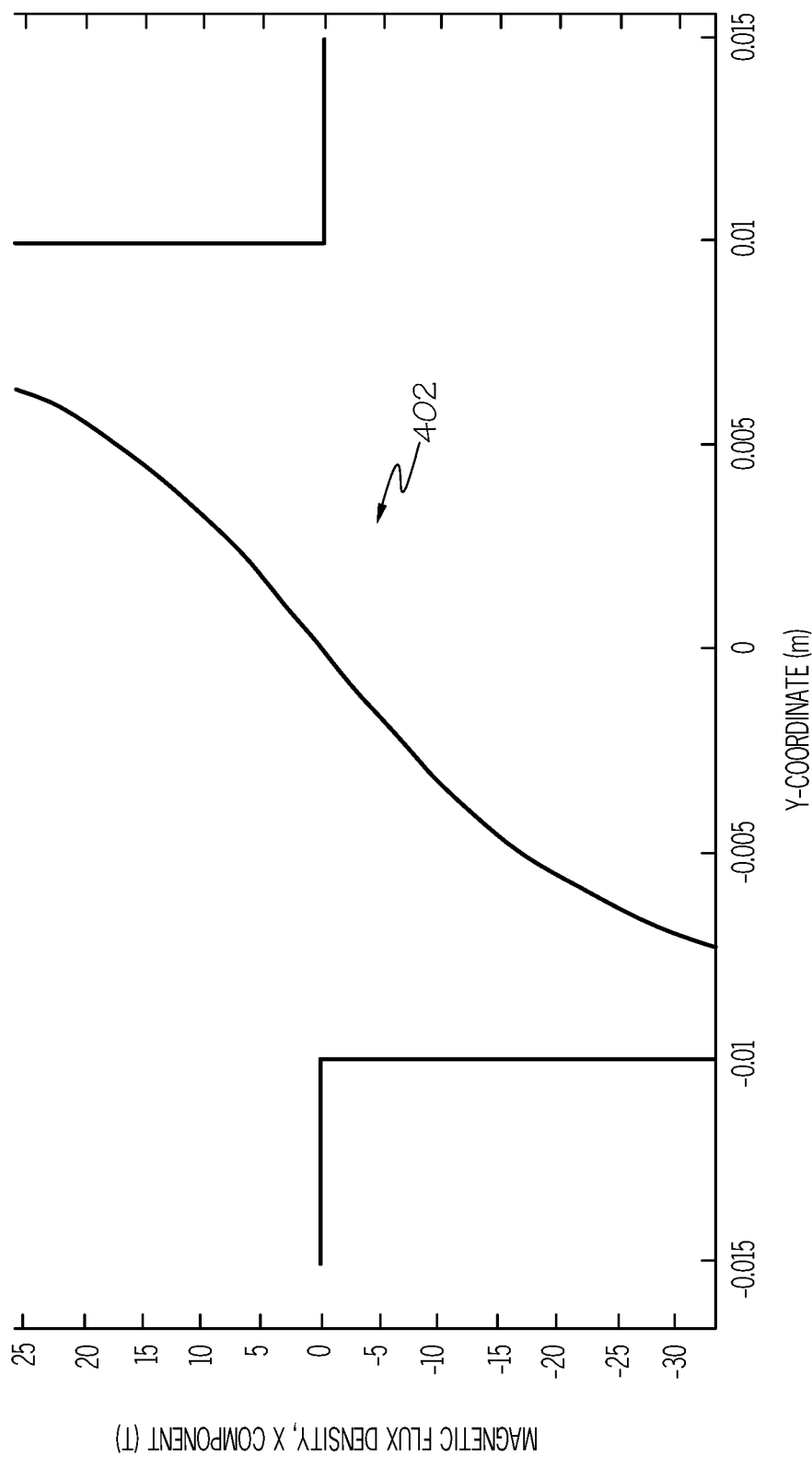
FIG. 4B is graph illustrating compression of the magnetic field measured across an aperture of the apparatus for magnetic field compression in a vertical or y-coordinate direction across the aperture in accordance with an embodiment of the present disclosure.

FIG. 4A is a graph 400 illustrating compression of a magnetic field measured across an aperture of an apparatus for magnetic field compression in a horizontal or x-coordinate direction across the aperture in accordance with an embodiment of the present disclosure. FIG. 4B is graph 402 illustrating compression of the magnetic field measured across the aperture of the apparatus in a vertical or y-coordinate direction across the aperture in accordance with an embodiment of the present disclosure. The apparatus is the same as or substantially similar to the apparatus 100 described with reference to FIGS. 1A and 1B. The x and y coordinate directions in FIGS. 4A and 4B correspond to the x and y coordinates illustrated in FIG. 1B. The vertical axis in each graph 400 and 402 is magnetic flux density measured in Tesla (T). The horizontal axis in each graph 400 and 402 is distance in meters (m) across the aperture 114. The zero (0) x-coordinate in FIG. 4A and zero (0) y-coordinate in FIG. 4B corresponds to the center of the aperture 114 in each direction. Magnetic flux density goes to zero (0) at the center of the aperture 114 and is at a maximum or highest strength of the magnetic field or magnetic flux density on either side of the center of the aperture 114. The magnetic field is oriented or directed in opposite directions on either side of the center of the aperture 114 according to the positive and negative values on the magnetic flux density scale or vertical scale but the magnetic flux density is at a maximum or highest strength or value representing compression of the magnetic field at these locations within the aperture 114 on either side of the center of the aperture 114.

Figure 6A:
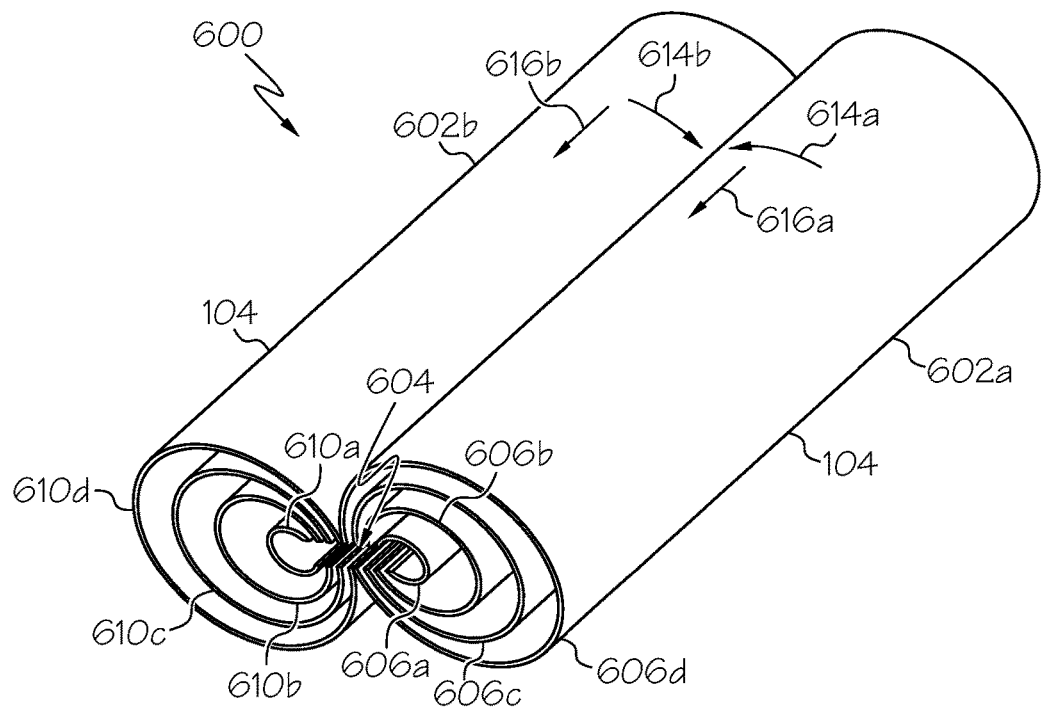
FIG. 6A is a perspective view of an example of an apparatus for magnetic field compression in accordance with another embodiment of the present disclosure.
Figure 6B:
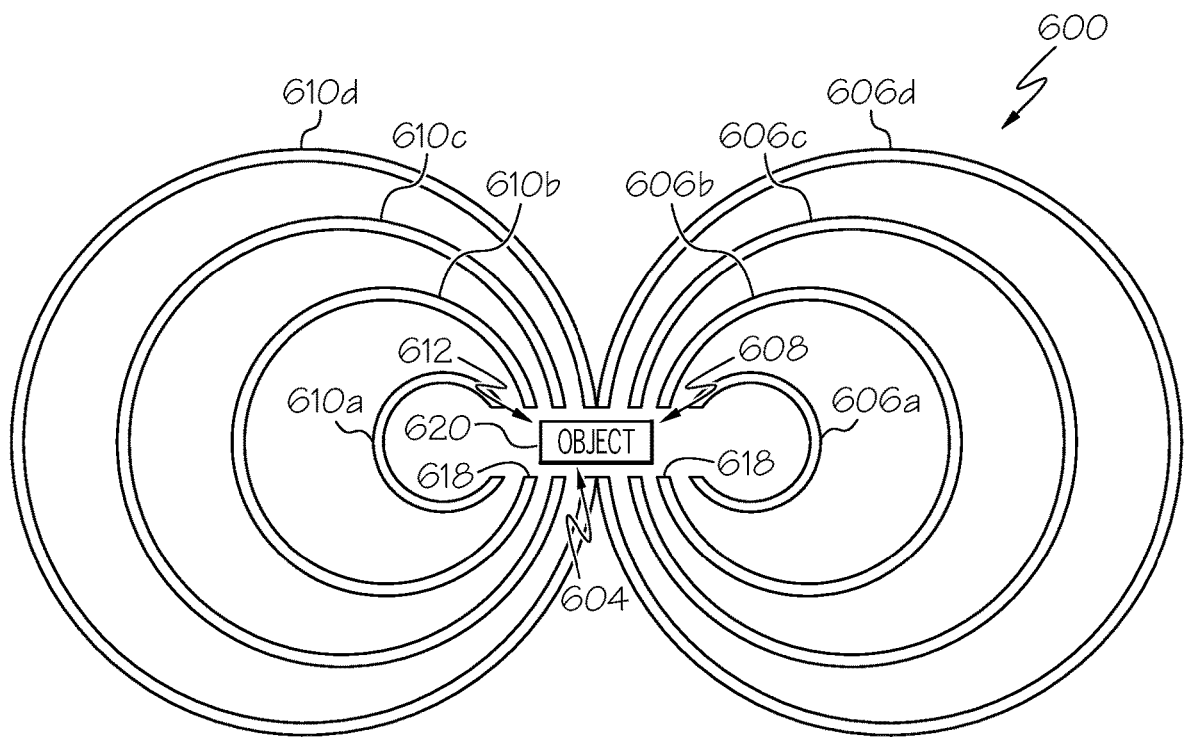
FIG. 6B is an end view of the exemplary apparatus for magnetic field compression in FIG. 6A.

FIG. 6A is a perspective view of an example of an apparatus 600 for magnetic field compression in accordance with another embodiment of the present disclosure. FIG. 6B is an end view of the exemplary apparatus 600 for magnetic field compression in FIG. 6A. The apparatus 600 includes two components 602a and 602b that are each similar to the apparatus 100 in FIGS. 1A and 1B wherein the apertures 114 are aligned or combined to form an enlarged cavity 604. Accordingly, the apparatus 600 includes a first plurality of tubes 606a-606d of different dimension and a first aperture 608. The apparatus 600 further includes a second plurality of tubes 610a-610d of different dimensions and a second aperture 612. In accordance with an embodiment, the first plurality of tubes 606a-606d and the second plurality of tubes 610a-610d are nonconcentric. The first aperture 608 and the second aperture 612 define the enlarged cavity 604 as best shown in FIG. 6B. Each smaller tube 606, 610 of the respective plurality of tubes 606a-606d and 610a-610d are disposed in a larger tube 606, 610 and extend parallel within the larger tube 606, 610. Each tube 606, 610 includes an electrically conductive material 104, similar to that previously described, for generating a first magnetic field 614a in the first component 602a and a second magnetic field 614b in the second component 602b in response to a first electric current 616*a* and a second electric current 616*b* respectively flowing in the electrically conductive material 104 in each respective component 602*a* and 602*b*.

A longitudinal slot 618 is formed in each tube 606, 610 of the first plurality of tubes 606*a*-606*d* and second plurality of tubes 610*a*-610*d*. The longitudinal slot 618 is similar to the longitudinal slot 112 in the tubes 102*a*-102*d* in FIGS. 1A and 1B. The longitudinal slot 618 in each tube 606, 610 is aligned to form the first and second apertures 608 and 612 in which a first magnetic field 614*a* and a second magnetic field 614*b* are compressed in response to the electric current 616*a* and 616*b* respectively flowing in the conductive material 104 of the respective tube 606 and 610. As previously described, the second aperture 612 is aligned with the first aperture 608 to form the enlarged cavity 604 in which the first magnetic field 614*a* and the second magnetic field 614*b* are both compressed in response to the electric current 616*a*, 616*b* respectively flowing in the conductive material 104 of the respective tubes 606 and 610. In accordance with an embodiment, the tubes 606, 610 are sized and the enlarged cavity 604 includes a predetermined size for inserting an object 620 within the enlarged cavity 604 similar to that described with respect to the apparatus 100 for performing an operation on the object 620, such as magnetic resonance imaging, controlling an electron beam or ion beam or performing some other function using the compressed or intensified magnetic fields 614*a* and 614*b* in the enlarged cavity 604.

In accordance with different embodiments, the tubes 606, 610 are formed similar to the tubes 102*a*-102*d*, 200 and 300 including forming using a superconducting material 212 as previously described. An electric current supply or supplies (not shown in FIGS. 6A and 6B) are connected to the tubes 606, 610 similar to that described with reference to FIG. 1B for causing current flow in the tubes 606, 610 and generation of magnetic fields between facing surfaces of the tubes 606 and 610 similar to that described with reference to FIG. 1B.

Figure 7:
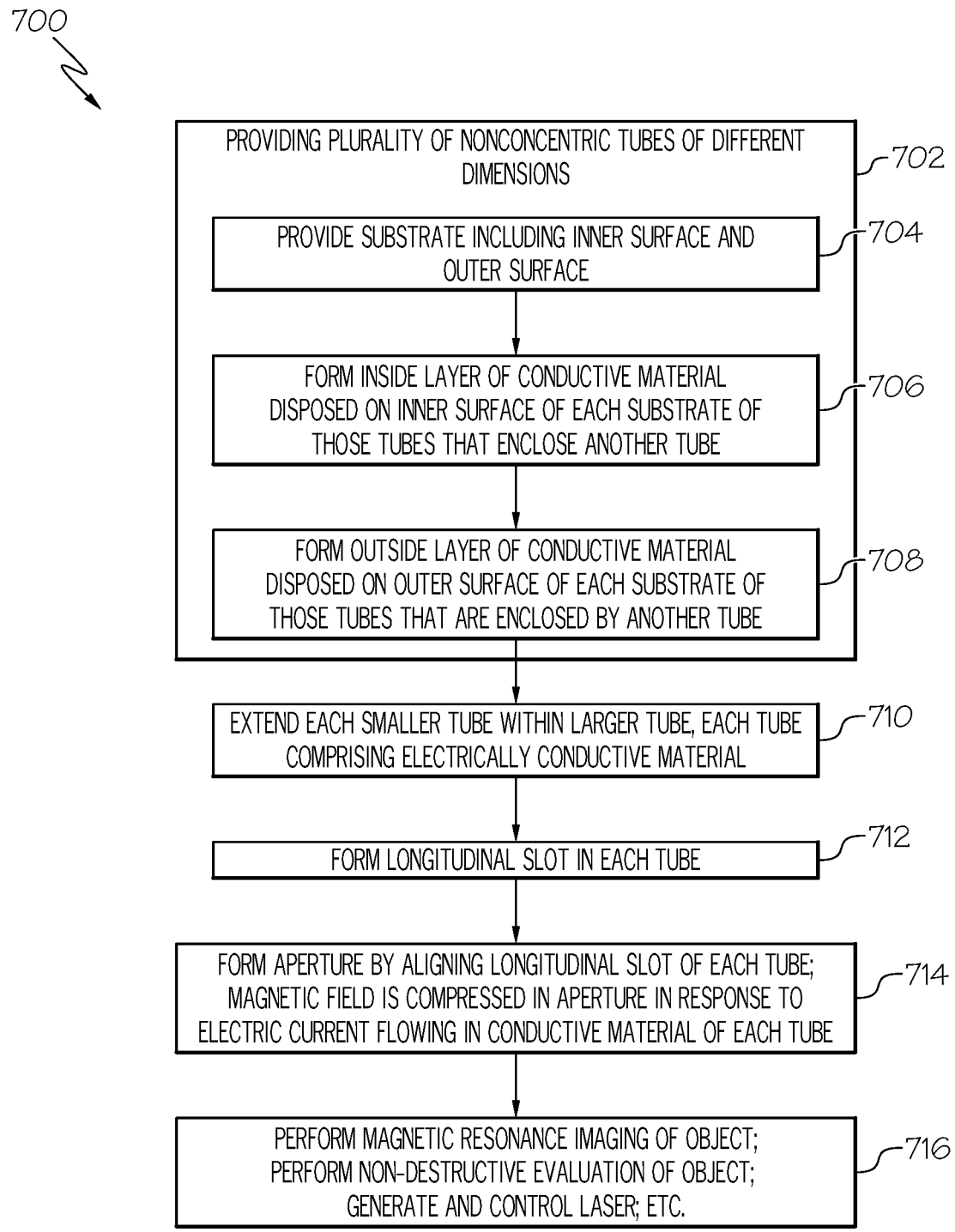
FIG. 7 is a flow chart of an example of a method for magnetic field compression in accordance with an embodiment of the present disclosure.

FIG. 7 is a flow chart of an example of a method 700 for magnetic field compression in accordance with an embodiment of the present disclosure. In accordance with an example, the method 700 is embodied in and performed by the apparatus 100 in FIGS. 1A and 1B or 600 in FIGS. 6A and 6B. In block 702, a plurality of tubes of different dimensions is provided. In accordance with an embodiment, the tubes are nonconcentric similar to that described herein. In accordance with an embodiment, the block 702 includes blocks 704-708.

In block 704, a substrate is provided. The substrate includes an inner surface and an outer surface. In block 706, a layer of electrically conductive material is formed or disposed on the inner surface of each substrate of at least those tubes that enclose another smaller tube. In block 708, an outside layer of electrically conductive material is formed or disposed on the outer surface of each substrate of at least those tubes that are enclosed by another larger tube.

In block 710, each smaller tube is disposed within a larger tube and extends within the larger tube parallel with the larger tube. The electrically conductive material on the tubes generate a magnetic field in response to electric current flowing in the conductive material.

In block 712, a longitudinal slot is formed in each tube. In block 714, an aperture is formed by aligning the longitudinal slot in each tube. The magnetic field is compressed in the aperture in response to the electric current flowing in the conductive material of each tube.

In block 716, in accordance with an embodiment, magnetic resonance imaging of an object is performed using the compressed magnetic field or fields. In accordance with another embodiment non-destructive evaluation is performed on an object using the compressed magnetic field or fields or some other function is performed using the compressed magnetic field or fields. In a further embodiment, an electron beam based laser or similar laser is generated and controlled using the compressed magnetic field or fields similar to that described in U.S. application Ser. No. 15/785,022, entitled "Apparatus and Method for Generating a High Power Energy Beam Based Laser."

In accordance with exemplary embodiments, the apparatuses and methods described herein are usable as part of a magnetic resonance image machine (not shown) for performing magnetic resonance imaging of an object, such as object 116 or 620. The apparatuses and methods are also applicable to non-destructive evaluation and imaging techniques, such as magnetic resonance imaging for medical purposes or other imaging applications. In another example described in U.S. application Ser. No. 15/785,022, entitled "Apparatus and Method for Generating a High Power Energy Beam Based Laser," the object 116 or 620 is an electron beam, ion beam or the like that is controlled by the apparatus. Accordingly, the tubes and/or aperture described herein are configured to control an electron beam, electron beam based laser, ion beam or the like. The apparatuses and methods described herein are applicable for any purpose where magnetic field compression or a high magnetic field strength or high magnetic flux up to about 10 T or higher is desired.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of embodiments of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to embodiments in the form disclosed. Many modifications and variations will be apparent to those of ordinary skill in the art without departing from the scope and spirit of embodiments.

Although specific embodiments have been illustrated and described herein, those of ordinary skill in the art appreciate that any arrangement which is calculated to achieve the same purpose may be substituted for the specific embodiments shown and that the embodiments have other applications in other environments. This application is intended to cover any adaptations or variations. The following claims are in no way intended to limit the scope of embodiments of the disclosure to the specific embodiments described herein.

What is claimed is:

1. An apparatus for magnetic field compression, comprising:
   a plurality of tubes of different dimensions, each smaller tube extending within a larger tube and each tube comprising an electrically conductive material for generating a magnetic field in response to electric current flowing in the conductive material; and
   a longitudinal slot formed in each tube, the longitudinal slot in each tube being aligned to form an aperture in which the magnetic field is compressed or has a highest magnetic flux in the aperture in response to the electric current flowing in the conductive material of each tube.

2. The apparatus of claim 1, wherein each of the plurality of tubes comprises:
   a substrate comprising an inner surface and an outer surface;
   an inside layer of electrically conductive material or semiconductor material disposed on the inner surface of each substrate of those tubes that enclose another tube of the plurality of tubes; and
   an outside layer of electrically conductive material or semiconductor material disposed on the outer surface of each substrate of those tubes that are enclosed by another tube of the plurality of tubes.

3. The apparatus of claim 2, wherein the substrate comprises one of an electrical insulator material, an electrical semiconductor material or an electrical conductive material.

4. The apparatus of claim 2, wherein the substrate comprises a material selected from a group consisting of magnesium oxide on metal, aluminum oxide on metal, yttrium oxide on metal, glass, sapphire covered tempered glass, carbon fiber composite, aluminate on metal, or aluminate on carbon fiber composite.

5. The apparatus of claim 2, wherein the inside layer and the outside layer of electrically conductive material or semiconductor material comprise a superconducting material.

6. The apparatus of claim 5, wherein the superconducting material comprises a superconducting crystalline material grown on the surfaces of the substrate, the substrate comprising a suitable material for growing the superconducting crystalline material.

7. The apparatus of claim 2, wherein the inside layer and the outside layer of electrically conductive material or semiconductor material comprise a superconducting metal alloy that is plated on the substrate, plasma sprayed on the substrate, or thermal-sprayed on the substrate, the substrate comprising a suitable mechanical frame for the superconducting metal alloy.

8. The apparatus of claim 7, wherein the substrate comprises one of steel, a nickel alloy and carbon fiber composite.

9. The apparatus of claim 2, further comprising an electric current supply electrically connected to each inside layer of electrically conductive material and each outside layer of electrically conductive material for generating an electric current flow in each layer of electrically conductive material and a compressed magnetic field in the aperture.

10. The apparatus of claim 9, wherein each electric current supply comprises an adjustable electric current supply configured for adjusting a balance of currents among the plurality of tubes and modifying the magnetic field across the aperture.

11. The apparatus of claim 1, wherein the tubes are substantially cylindrically-shaped.

12. The apparatus of claim 1, wherein the tubes are non-cylindrically-shaped.

13. The apparatus of claim 1, further comprising a device for circulating a coolant between the tubes.

14. The apparatus of claim 1, wherein the aperture comprises a predetermined size for inserting an object within the aperture.

15. The apparatus of claim 1, wherein the aperture is configured to control an electron beam based laser.

16. The apparatus of claim 1, wherein the tubes are nonconcentric.

17. The apparatus of claim 1, wherein the plurality of tubes define a first plurality of nonconcentric tubes and the aperture defines a first aperture in which a first magnetic field is compressed in response to a first electric current flowing in the first plurality of nonconcentric tubes, the apparatus further comprising:
   a second plurality of nonconcentric tubes of different dimensions, each smaller tube extending within a larger tube and each tube comprising an electrically conductive material for generating a second magnetic field in response to electric current flowing in the electrically conductive material; and
   a longitudinal slot formed in each tube of the second plurality of nonconcentric tubes, the longitudinal slot in each tube being aligned to form a second aperture in which the second magnetic field is compressed in the second aperture in response to the electric current flowing in the conductive material of each tube, wherein the second aperture is aligned with the first aperture to form an enlarged cavity in which the first magnetic field and the second magnetic field are both compressed or have a highest magnetic flux in response to the electric current flowing in the conductive material of each tube.

18. An apparatus for magnetic field compression, comprising:
   a plurality of cylindrical tubes of different diameters, each smaller cylindrical tube extending within a larger cylindrical tube and each cylindrical tube comprising an electrically conductive material for generating a magnetic field in response to electric current flowing in the conductive material; and
   a longitudinal slot formed in each cylindrical tube, the longitudinal slot in each cylindrical tube being aligned to form an aperture in which the magnetic field is compressed or has a highest magnetic flux in the aperture in response to the electric current flowing in the conductive material of each tube.

19. The apparatus of claim 17, wherein each of the plurality of cylindrical tubes comprises:
   a substrate comprising an inner surface and an outer surface;

an inside layer of electrically conductive material or semiconductor material disposed on the inner surface of each substrate of those tubes that enclose another tube of the plurality of tubes; and an outside layer of electrically conductive material or semiconductor material disposed on the outer surface of each substrate of those tubes that are enclosed by another tube of the plurality of tubes.

20. A method for magnetic field compression, comprising
providing a plurality of tubes of different dimensions;
extending each smaller tube within a larger tube, each tube comprising an electrically conductive material for generating a magnetic field in response to electric current flowing in the conductive material; and
forming a longitudinal slot in each tube;
forming an aperture by aligning the longitudinal slot in each tube, wherein the magnetic field is compressed or has a highest magnetic flux in the aperture in response to the electric current flowing in the conductive material of each tube.

* * * * *